United States Patent
Chou et al.

(10) Patent No.: US 9,893,111 B2
(45) Date of Patent: Feb. 13, 2018

(54) FULL-PDAF (PHASE DETECTION AUTOFOCUS) CMOS IMAGE SENSOR STRUCTURES

(71) Applicant: Taiwan Semiconductor Manufacturing Co., Ltd., Hsin-Chu (TW)

(72) Inventors: Keng-Yu Chou, Kaohsiung (TW); Chun-Hao Chuang, Hsinchu (TW); Chien-Hsien Tseng, Hsinchu (TW); Dun-Nian Yaung, Taipei (TW); Wei-Chieh Chiang, Yuanlin Township (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 15/097,319

(22) Filed: Apr. 13, 2016

(65) Prior Publication Data

US 2017/0301718 A1 Oct. 19, 2017

(51) Int. Cl.
*H01L 27/148* (2006.01)
*H01L 27/146* (2006.01)
(Continued)

(52) U.S. Cl.
CPC ........ *H01L 27/14645* (2013.01); *G03B 13/36* (2013.01); *H01L 27/1463* (2013.01); *H01L 27/14603* (2013.01); *H01L 27/14614* (2013.01); *H01L 27/14621* (2013.01); *H01L 27/14627* (2013.01); *H04N 5/374* (2013.01)

(58) Field of Classification Search
USPC ........................ 257/231; 250/208.1
See application file for complete search history.

(56) References Cited

U.S. PATENT DOCUMENTS 9,231,005 B2 * 1/2016 Meynants ......... H01L 27/14605
2014/0145068 A1 * 5/2014 Meynants ......... H01L 27/14605
250/208.1

(Continued)

OTHER PUBLICATIONS

Yokogawa, et al. "A 4M Pixel Full-PDAF CMOS Image Sensor with 1.58μm 2×1 On-Chip Micro-Split-Lens Technology." 2015 International Image Sensor Workshop (IISW) Jun. 8-11, 2015 in Vaals, The Netherlands.

*Primary Examiner* — Telly Green
(74) *Attorney, Agent, or Firm* — Eschweller & Potashnik, LLC

(57) ABSTRACT

The present disclosure relates to an image sensor having autofocus function and associated methods. In some embodiments, the image sensor has first and second image sensing pixels arranged one next to another in a row. Each of the first and second image sensing pixels respectively have a left PD (phase detection) pixel including a left photodiode operably coupled to a left transfer gate, and a right PD pixel including a right photodiode operably coupled to a right transfer gate. The right transfer gate of the second image sensing pixel is a mirror image of the left transfer gate of the first image sensing pixel along a boundary line between the first and second image sensing pixels. The left transfer gate of the second image sensing pixel is a mirror image of the right transfer gate of the first image sensing pixel along the boundary line.

20 Claims, 7 Drawing Sheets

(51) Int. Cl.
*H04N 5/374* (2011.01)
*G03B 13/36* (2006.01)

(56) References Cited

U.S. PATENT DOCUMENTS

2015/0062390 A1* 3/2015 Kim .......................... G02B 7/34
348/273
2016/0198141 A1* 7/2016 Fettig ................. H04N 13/0217
348/46
2016/0286108 A1* 9/2016 Fettig .................... H04N 5/235

* cited by examiner

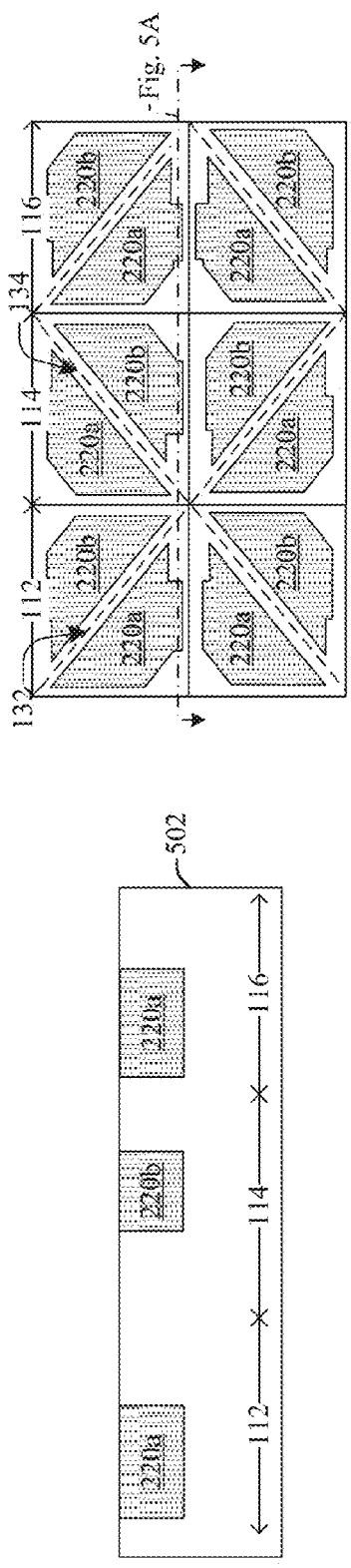
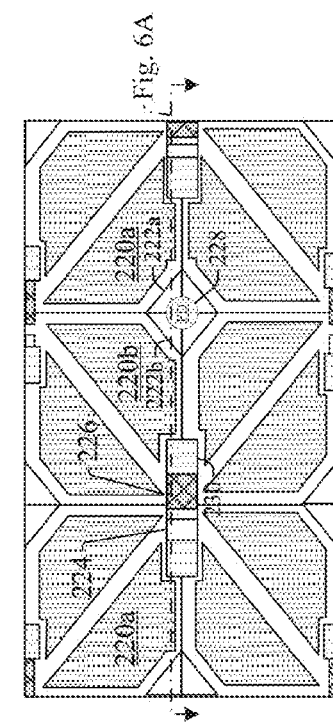
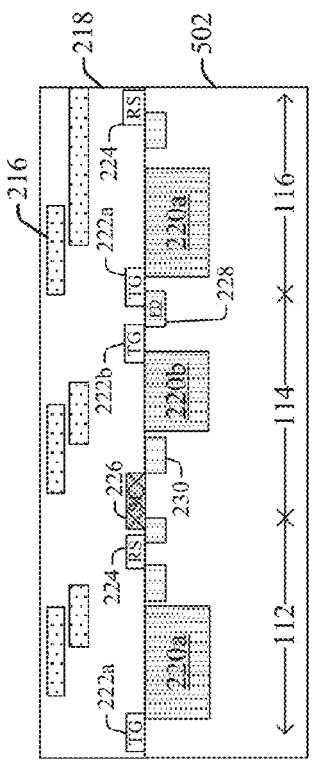

FULL-PDAF (PHASE DETECTION AUTOFOCUS) CMOS IMAGE SENSOR STRUCTURES

BACKGROUND

Optical imaging sensors are widely employed in today's electronic devices from digital cameras to other portable devices. An optical image sensor includes an array of sensing pixels and supporting logic circuitry that converts optical images to digital data. Performance of the optical image sensor can be improved by improving light sensing of individual pixels, crosstalk between pixels, and/or algorithms used by the supporting logic circuitry. However, the optical image sensor cannot perform well if the image is out of focus. Therefore, phase detection pixels are incorporated in optical image sensors to automatically locate where a lens should focus, without blindly scanning a large range to try to detect a correct position for the lens.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5B, 6A-6B, 7, and 8A-8B illustrate a series of cross-sectional views and corresponding top views of some embodiments of a method for manufacturing a CMOS image sensor pixel array at various stages of manufacture.

DETAILED DESCRIPTION

Figure 1:
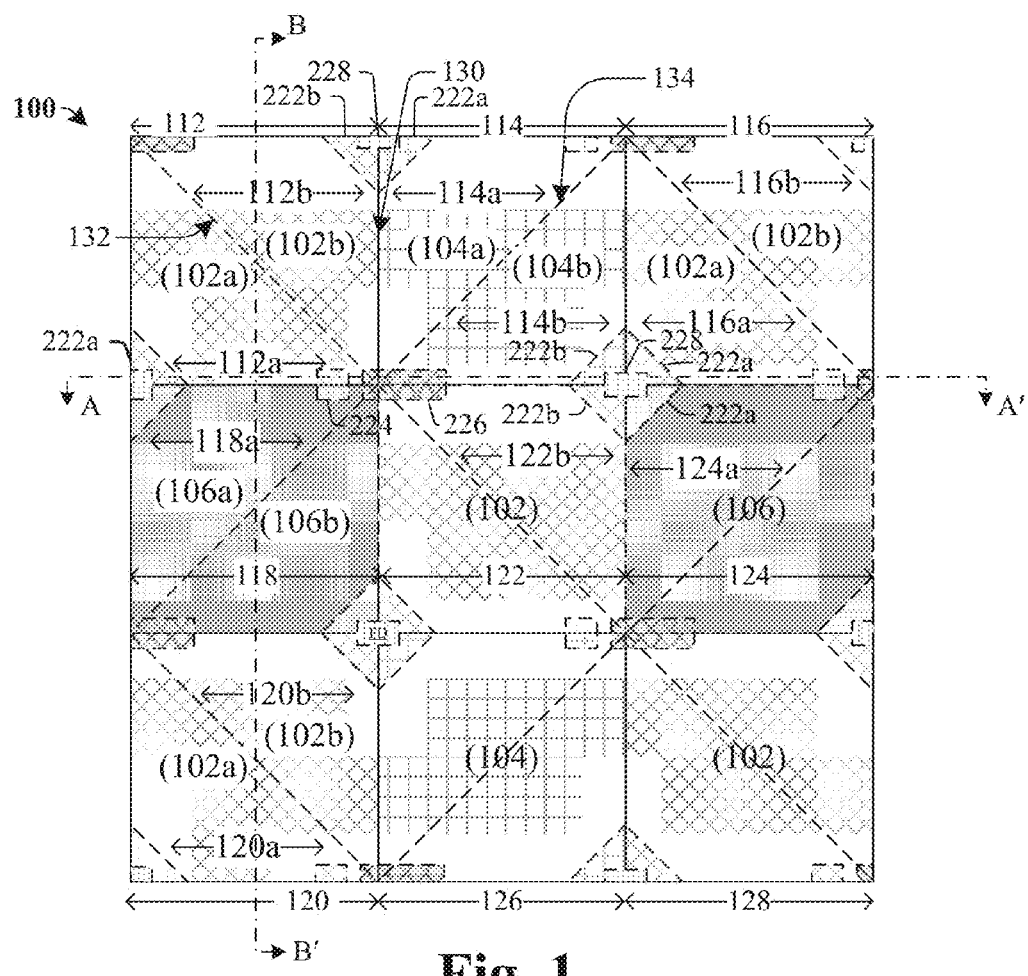
FIG. 1 illustrates a top view of some embodiments of a CMOS image sensor pixel array including image sensing pixels.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

A CMOS image sensor with autofocus functionality comprises a pixel array including image sensing pixels configured to detect image shape and color, and phase detection pixels configured to detect image position for a proceeding focusing operation. The image sensing pixels comprise a plurality of color filters overlying photodiodes. The color filters are arranged at staggered locations and are configured to filter out certain ranges of radiation spectrums. The photodiodes detect radiation intensities received by the image sensing pixels after filtering by the color filters. The phase detection pixels are arranged in pairs. A pair of phase detection pixels has opposite sides open to incident radiation. For example, in some cases, one phase detection pixel of the pair has a left half region transparent to at least some incident radiance while a right half region is blocked by an opaque structure. The other phase detection pixel of the pair has a right half region transparent to at least some of the incident radiance while a left half region blocked by an opaque structure. Thus, the received radiance of the phase detection pixel pair has a phase difference from which the focus condition of the sensor can be determined.

The phase detection pixels enable a focus function of the CMOS image sensor. However, phase detection pixels occupy spaces that could otherwise contain additional image sensing pixels or reduce images sensor size. Besides, the opaque structures also reduce angular response sensitivity (over incident angles) of the phase detection pixels or imaging sensitivity of the image sensing pixels due to unwanted reflections. For example, incident radiation passing into an image sensing pixel may be reflected off surfaces of the opaque structures before being provided to an underlying photodiode, depending on an incident angle and relative reflective index. The reflected radiation reduces an angular response of the phase detection pixel since photodiode receives unwanted reflected radiations, thereby negatively affecting the phase detection of the pixel.

The present disclosure relates to a phase detection autofocus (PDAF) technique including autofocus image sensors and associated sensing methods to achieve efficient sensing and focusing operations. In some embodiments, a CMOS image sensor includes an array of image sensing pixels comprising first and second image sensing pixels arranged one next to another in a row and separated by a boundary line. Each of the first and second image sensing pixels respectively comprises a left PD (phase detection) pixel including a left photodiode operably coupled to a left transfer gate, and a right PD pixel including a right photodiode operably coupled to a right transfer gate. The left and right transfer gates are operably coupled to a common floating node at the boundary line. The right transfer gate of the second image sensing pixel is a mirror image of the left transfer gate of the first image sensing pixel, and the left transfer gate of the second image pixel is a mirror image of the right transfer gate of the first image sensing pixel. By arranging the array of CMOS image sensing pixels as described above, resources (e.g. the floating node, source-follower transistors, switching transistors) can be shared between multiple image sensing pixels (e.g. four image sensing pixels), thereby improving image sensing and focusing efficiencies.

FIG. 1 shows a top view of a CMOS image sensor pixel array 100 having image sensing pixels arranged in rows and columns according to some embodiments. Notably, though a 3×3 image sensing pixel array is shown in FIG. 1, the pixel array 100 is extendable to any suitable size for varies applications.

The CMOS image sensor pixel array 100 comprises image sensing pixels 112, 114 and 116 arranged next to one another in a first row, image sensing pixels 118, 122 and 124 arranged in a second row next to the first row, and image sensing pixels 120, 126 and 128 arranged in a third row next to the second row. The image sensing pixels 118, 122 and 124 are respectively aligned with the image sensing pixels 112, 114 and 116 along a column direction that is perpendicular to the rows.

One image sensing pixel of the pixel array 100 is divided into a pair of phase detection pixels comprising a left PD (phase detection) pixel and a right PD pixel. For example, a first image sensing pixel 112 is divided along a first separating line 132 into a left PD pixel 112a and a right PD pixel 112b. A second image sensing pixel 114 is divided along a second separating line 134 into a left PD pixel 114a and a right PD pixel 114b. The first separating line 132 or the second separating line 134 extends in a direction non-orthogonal to a boundary line 130 between the first image sensing pixel 112 and the second image sensing pixel 114. In some embodiments, the first separating line 1 32 or the second separating line 134 is along a diagonal line of the corresponding pixels, so that each of the left and right PD pixels (e.g. 112a, 112b or 114a, 114b) has a right triangle-shape. In some embodiments, separating lines of neighboring pixels, such as the first separating line 132 and the second separating line 134, are along cross diagonal lines of the corresponding pixels. The first separating line 132 and the second separating line 134 may be perpendicular to one another. Thus, hypotenuses of the left and right PD pixels 112a, 112b of the first image sensing pixel 112 are perpendicular to those of the left and right PD pixels 114a, 114b of the second image sensing pixel 114.

Each of the left PD pixels (e.g. 112a, 116a) comprises a left transfer gate 222a, and each of the right PD pixels (e.g. 114b) comprises a right transfer gate 222b. In some embodiments, transfer gates of neighboring PD pixels are mirror images along a boundary line between the two image sensing pixels. For example, the right transfer gate 222b of the second image sensing pixel 114 is a mirror image of the left transfer gate 222a of the first image sensing pixel 112 along the boundary line 130. The left transfer gate 222a of the second image sensing pixel 114 is also a mirror image of the right transfer gate 222b of the first image sensing pixel 112 along the boundary line 130.

In some embodiments, the right transfer gate 222b of the first image sensing pixel 112 and the left transfer gate 222a of the second image sensing pixel 114 are operably coupled to a common floating node region 228. In some embodiments, the common floating node may also be coupled to transfer gates in an adjacent row so that a 2×2 phase detection pixel array is coupled to one common floating node region through corresponding transfer gates. For example, the right transfer gates 222b of right PD pixels 114b and 122b in one column and the left transfer gates 222a of left PD pixels 116a, 124a in another column are operably coupled to the same common floating node region 228.

A reset switch transistor 224 and a source follower transistor 226 are shared and disposed between the left photodiode 220a of the first image sensing pixel 112 and the right photodiode 220b of the second image sensing pixel 114. Since patterns of the phase detection pixel array are arranged that four phase detection pixels share one floating node region, one source follower transistor, or other processing and control devices, chip spaces are efficiently used and sensitivities of the image sensor can be improved.

Figure 2:
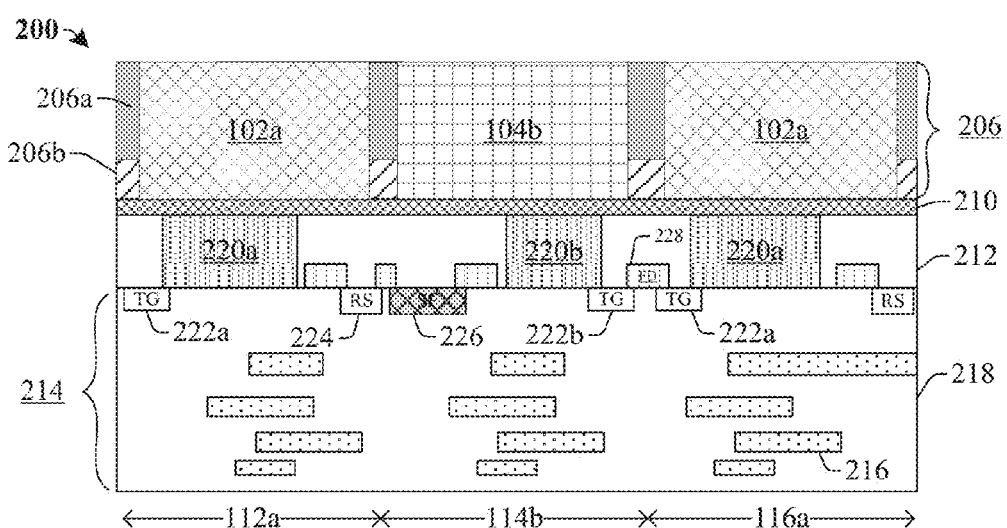
FIG. 2 illustrates a cross-sectional view of some embodiments of the CMOS image sensor pixel array of FIG. 1.

FIG. 2 illustrates a cross-sectional view 200 of the CMOS image sensor pixel array 100 of FIG. 1 (along line A-A') according to some embodiments.

As shown in cross-sectional view 200, the CMOS image sensor pixel array has left and right photodiodes 220a, 220b of the left and right phase detection pixels. The left and right photodiodes 220a, 220b are arranged within a substrate 212. Each of the left PD pixels (e.g. 112a, 116a) comprises a left transfer gate 222a operably coupled to a left photodiode 220a, and each of the right PD pixels (e.g. 114b) comprises a right transfer gate 222b operably coupled to a right photodiode 220b.

A color filter array is disposed over the substrate 212, comprising color filters divided into left color filters (e.g. 102a, 104a, 106a) overlying the corresponding left photodiodes 220a and right color filters (e.g. 102b, 104b, 106b) overlying the corresponding right photodiodes 220b. In some embodiment, color filters 102, 104, 106 filter different spectrums of radiation. For example, for a RGB image sensor, a first color filter 102 can be configured to transmit blue light while blocking other colors; a second color filter 104 can be configured to transmit red light; and a third color filter 106 can be configured to transmit green light. The left color filter and the right color filter of the same image sensing pixel are configured to filter the same spectrum of radiation. For example, the left color filter 102a and the right color filter 102b of the first image sensing pixel 112 are configured to transmit blue light.

A composite grid 206 is disposed between the color filters for isolation purpose. In some embodiments, the composite grid 206 comprises a metal grid structure 206b disposed within a dielectric light guide structure 206a. In some embodiments, the dielectric light guide structure 206a may comprise one or more dielectric structures, for example, a silicon nitride grid, silicon oxynitride grid, or a silicon dioxide grid. In some embodiments, a buffer layer 210 can be disposed between the color filter array and the photodiode array, configured to improve transmission of the incident radiance.

In some embodiments, an interconnect structure 214 is arranged under the substrate 212 opposite the color filter array. The interconnect structure 214 comprises a plurality of metal lines 216 (e.g., copper wires and/or vias) arranged within one or more dielectric layers 218. In some embodiments, the transfer gates 222a, 222b and some processing devices such as the source follower transistors 226 or the reset switch transistors 224 may be arranged within the substrate 212 and the dielectric layers 218. An image signal processor is configured to receive and compute radiation intensity signals from the phase detection pixels and generate a signal related to focus conditions of an image sensor. It is appreciated that although a back illumination structure (BIS) is shown by FIG. 2, a front-illumination structure (FIS) is also amenable.

Figure 3:
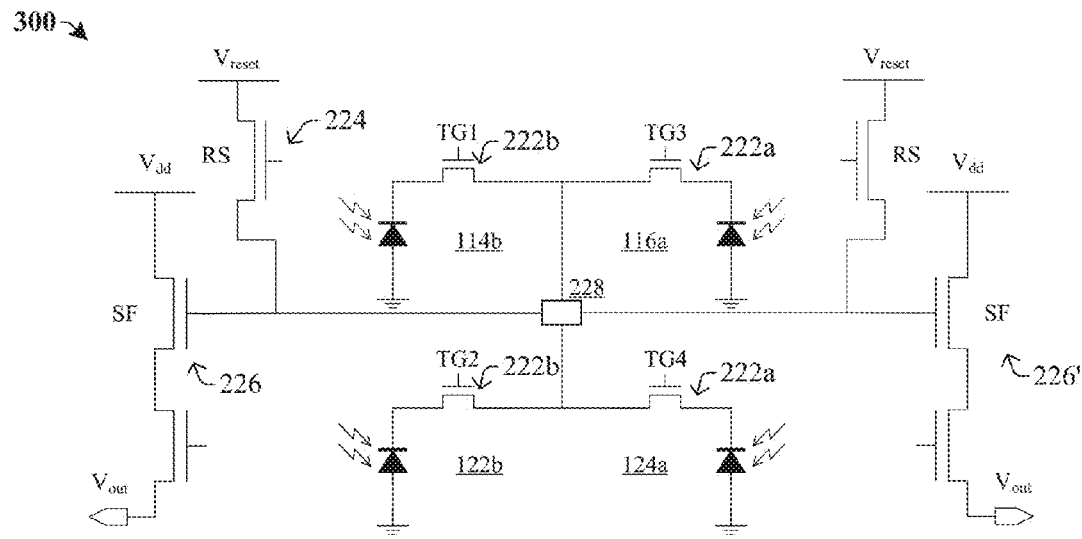
FIG. 3 illustrates a circuit diagram of some embodiments of the CMOS image sensor pixel array of FIG. 1.

FIG. 3 is a circuit diagram showing coupling relations of the PD pixels 114b, 122b, 116a and 124a within the CMOS image sensor pixel array 100 of FIG. 1 according to some embodiments. In some embodiments, a 2×2 phase detection pixel array is coupled to a gate of a shared source follower transistor. For example, right PD pixels 114b, 122b in one column and the left PD pixels 112a, 118a in another column are operably coupled to the same shared source follower transistor 226. FIG. 3 shows the right PD pixels 114b, 122b are coupled to the gate of the shared source follower transistor 226 through the common floating node region 228, while the left PD pixels 116a, 124a are coupled to a different source follower transistor 226'. Though not shown in FIG. 3, the source follower transistor 226 can be further shared by the left PD pixels 112a, 118a as described above.

FIGS. 4A-4E show some cross-sectional views 400a-400e of the CMOS image sensor pixel array 100 of FIG. 1 (along line B-B') according to some varied embodiments.

Figure 4A:
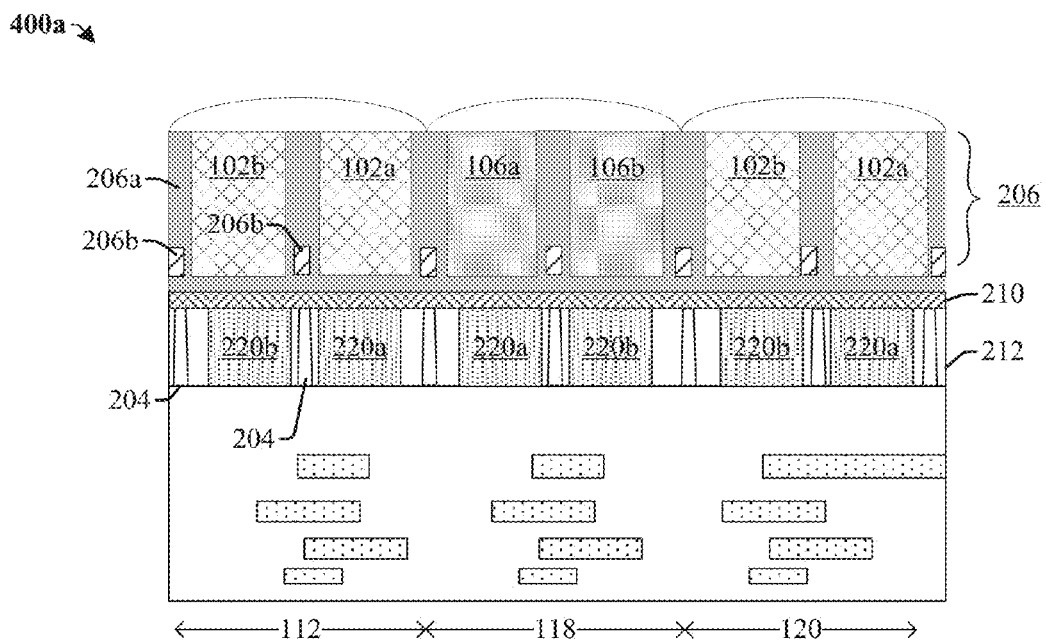
FIGS. 4A-4E illustrate cross-sectional views of some varied embodiments of the CMOS image sensor pixel array of FIG. 1.

As shown in FIG. 4A, the composite grid 206 separates each of the left or right color filters from the neighboring left or right color filters (e.g. 102a, 102b, 104a, 104b). The dielectric light guide structure 206a has an upper surface aligned with that of the left or right color filters. The metal grid 206b is arranged between the neighboring phase detection pixels (e.g. 112, 118) and also between the neighboring left and right color filters (e.g. 102a, 102b) of the same phase detection pixel pair. In some embodiments, an isolation structure 204 is disposed within the substrate 212. The isolation structure 204 may comprise a plurality of dielectric trench isolation structures between neighboring photodiodes 220a, 220b.

Figure 4B:
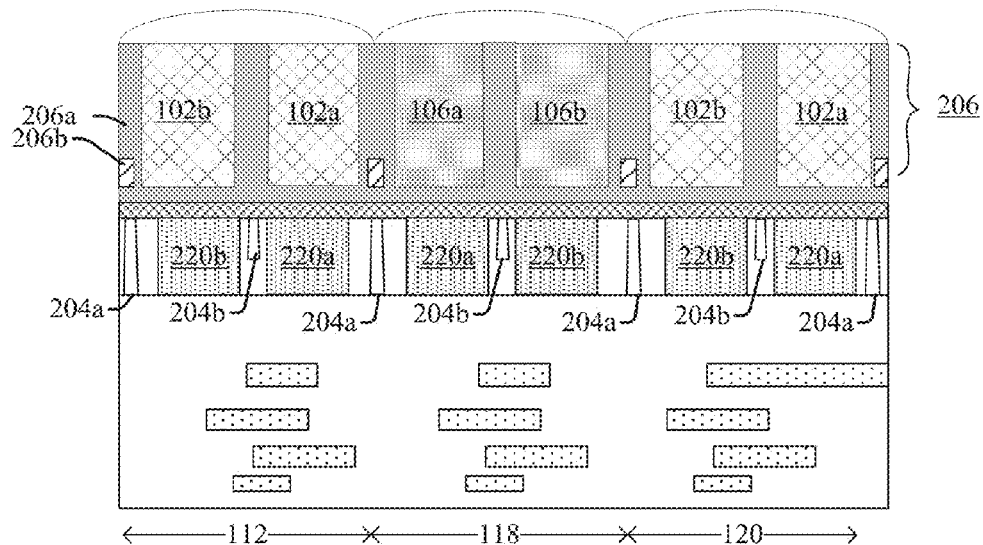

As shown in FIG. 4B, in some alternative embodiments, the metal grid structure 206b of the composite grid structure 206 can be arranged between the neighboring phase detection pixels (e.g. 112, 118) but absent between the neighboring left and right color filters (e.g. 102a, 102b) of the same phase detection pixel pair. In this way, unwanted reflection of the incident radiance caused by the metal grid can be reduced compared to the metal grid shown in FIG. 4A. The dielectric light guide structure 206a is disposed between the neighboring left and right color filters (e.g. 102a, 102b), in order to guide the incident radiance to the corresponding photodiodes (e.g. 220a, 220b) and reduce crosstalk. In some embodiments, the isolation structure 204 within the substrate 212 includes a first portion 204a disposed between the image sensing pixels (e.g. 112, 118) and a second portion 204b disposed between the neighboring left and right photodiodes (e.g. 220a, 220b). The second portion 204b can be shallower than the first portion 204a.

Figure 4C:
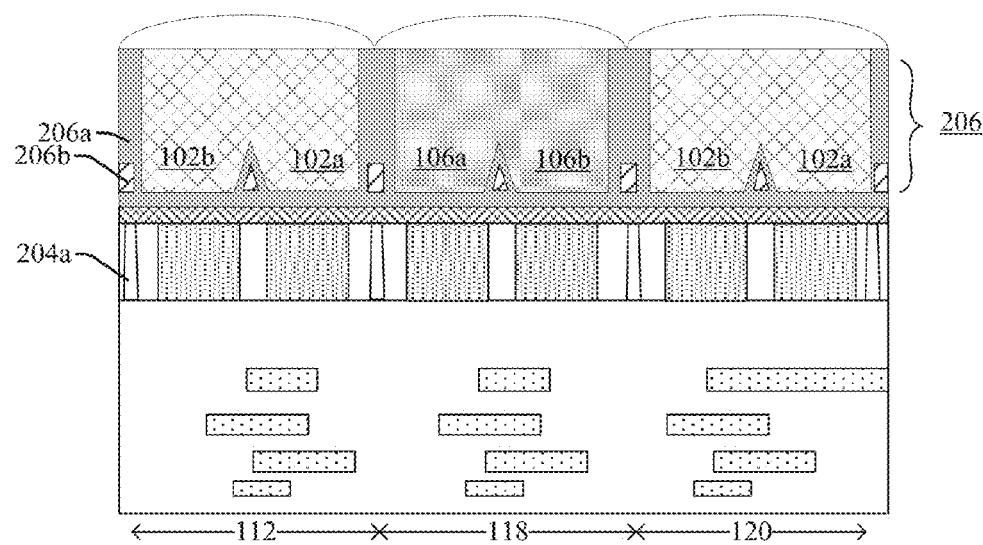

As shown in FIG. 4C, in some alternative embodiments, the dielectric light guide structure 206a within an image sensing pixel (e.g. 112) may have a height smaller than a height of the left or right color filters (e.g. 102a, 102b). The left and right color filters (e.g. 102a, 102b) of the same image sensing pixel (e.g. 112) may be separated by the dielectric light guide structure 206a and/or the metal grid structure 206b at a lower portion and seamless at an upper portion. Thus, a greater amount of incident radiance can pass through the color filters and be received by the photodiodes. The dielectric light guide structure 206a and/or the metal grid structure 206b within an image sensing pixel (e.g. 112) may have tilted sidewalls to guide the incident radiance to the corresponding photodiodes and improve sensitivity.

Figure 4D:
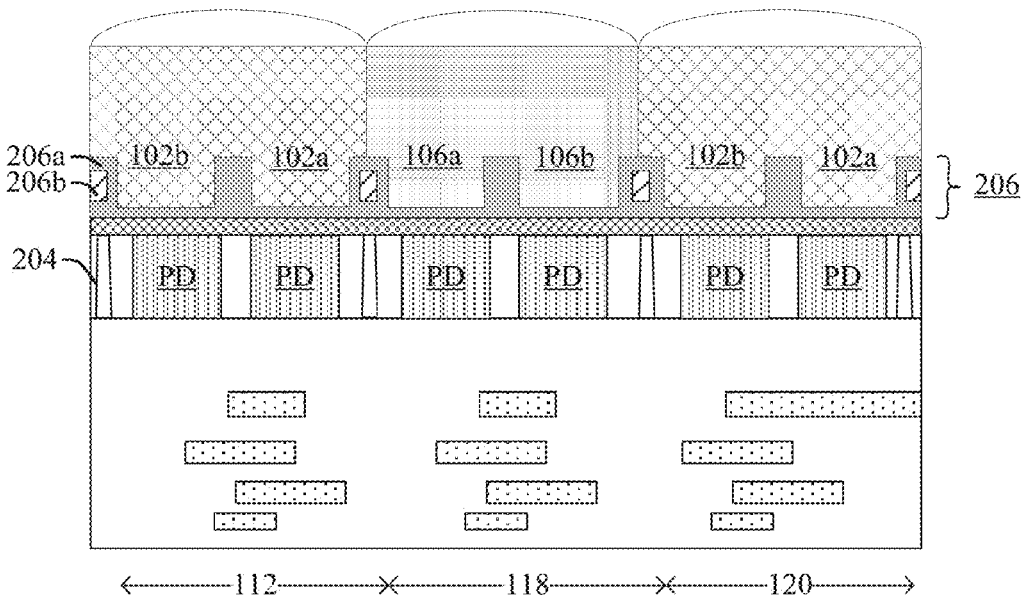

As shown in FIG. 4D, in some further alternative embodiments, the dielectric light guide structure 206a has a height smaller than the left or right color filters (e.g. 102a, 102b) such that upper portions of the left or right color filters are extended to be in direct contact with neighboring color filters and received light intensities are maximized.

Figure 4E:
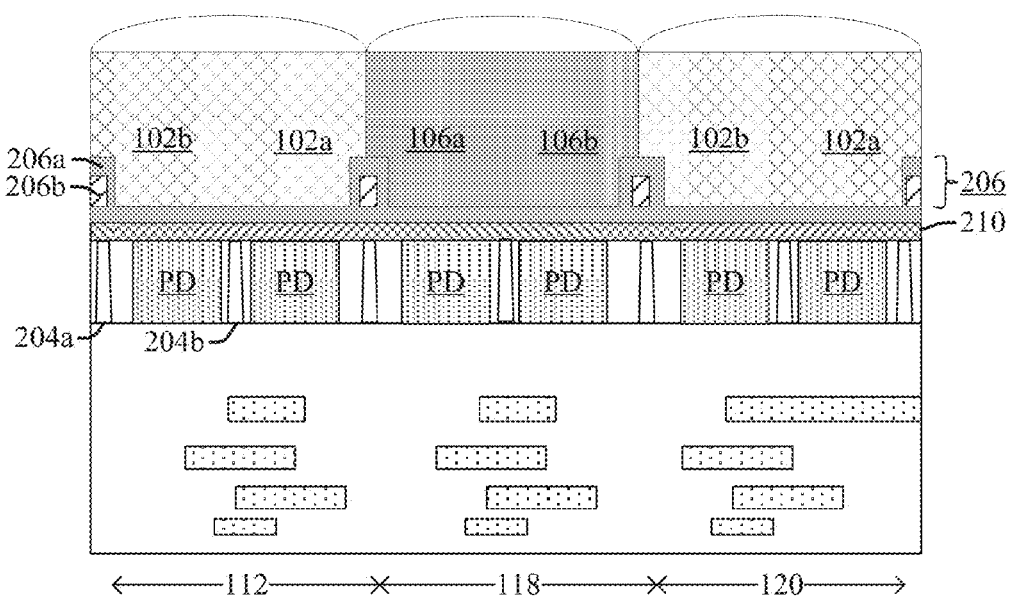

As shown in FIG. 4E, in some alternative embodiments, the dielectric light guide structure 206a can be arranged between the neighboring phase detection pixels (e.g. 112, 118) but absent between the neighboring left and right color filters (e.g. 102a, 102b) of the same phase detection pixel pair. The dielectric light guide structure 206a may extend laterally between the color filters and the underlying anti-reflective layer and/or buffer layer 210.

FIGS. 5A-5B, 6A-6B, 7, and 8A-8B illustrate a series of cross-sectional views 500a, 600a, 700, 800a and corresponding top views 500b, 600b, 800b of a method for manufacturing a CMOS image sensor pixel array at various stages of manufacture according to some embodiments. Although the cross-sectional and top views 500a-500b, 600a-600b, 700, 800a-800b are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

As shown in cross-sectional view 500a of FIG. 5A, a plurality of photodiodes including left photodiodes 220a and right photodiodes 220b are formed within a substrate 502. In some embodiments, the substrate 502 can be formed from a bulk semiconductor wafer having a first conductivity type at a first doping concentration. For example, the substrate 502 can be a silicon wafer that is lightly doped with a p-type dopant. The substrate 502 can be implemented as a bulk silicon wafer substrate, a binary compound substrate (e.g., GaAs wafer), a ternary compound substrate (e.g., AlGaAs), or higher order compound wafers, among others. The photodiodes 220a, 220b are formed by a combination of doped regions, including at least two oppositely-doped regions. In some embodiments, a heavily doped P-type region may be integrated into an N-well to form a P-N junction of the photodiodes 220a, 220b. In some embodiments, the photodiodes 220a, 220b are formed by implanting a heavily doped N-type region and heavily doped P-type region into the lightly-doped P-type substrate 212. A pattern of the plurality of photodiodes 220a, 220b is shown in FIG. 5B according to some embodiments. The left photodiode 220a and the right photodiodes 220b of a first image sensing pixel 112 are formed separately along a first separating line 132. The first separating line 132 may extend along a diagonal line of the first image sensing pixel 112. The left photodiode 220a and the right photodiodes 220b of a second image sensing pixel 114 are formed separately along a second separating line 134. The second separating line 134 may extend along an opposite diagonal line of the second image sensing pixel 114 that cross the first separating line 132 of the first image sensing pixel 112.

As shown in cross-sectional view 600a of FIG. 6A and top view 600b of FIG. 6B, a plurality of processing devices are formed over the substrate 502. Left transfer gates 222a and right transfer gates 222b are formed alongside the corresponding left photodiodes and right photodiodes. In some embodiments, the transfer gates 222a, 222b are formed at opposing corners of the image sensing pixels as shown in FIG. 6B. A 2×2 transfer gate array may be formed at a cross region of a 2×2 image sensing pixel array. A common floating node region 228 is formed within the substrate 502 and surrounded by the 2×2 transfer gate array. In some embodiments, a set of a reset switch transistor 224 and a source follower transistor 226 is formed at a cross regions of a 2×2 image sensing pixel array next to the 2×2 transfer gate array. Source/drain regions 230 are formed alongside the gates of the reset switch transistor 224 and the source follower transistor 226.

Figure 7:
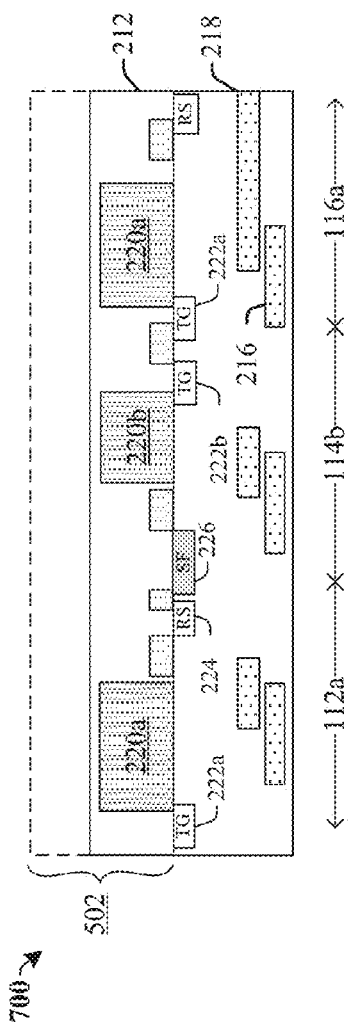

As shown in cross-sectional view 700 of FIG. 7, the workpiece is flipped over and thinned down from a back side of the substrate 212 by a thinning process. The substrate 212 may be thinned by a chemical-mechanical polishing process and/or other etching processes. In some embodiments, photodiodes 220a, 220b are exposed from the back side of the substrate after the thinning process.

Figure 8B:
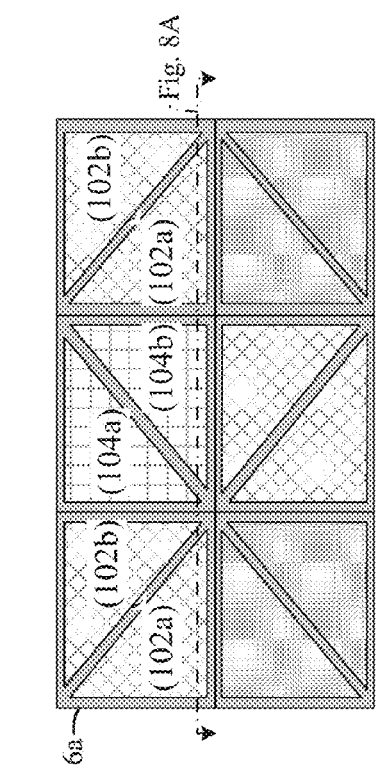
Figure 8A:
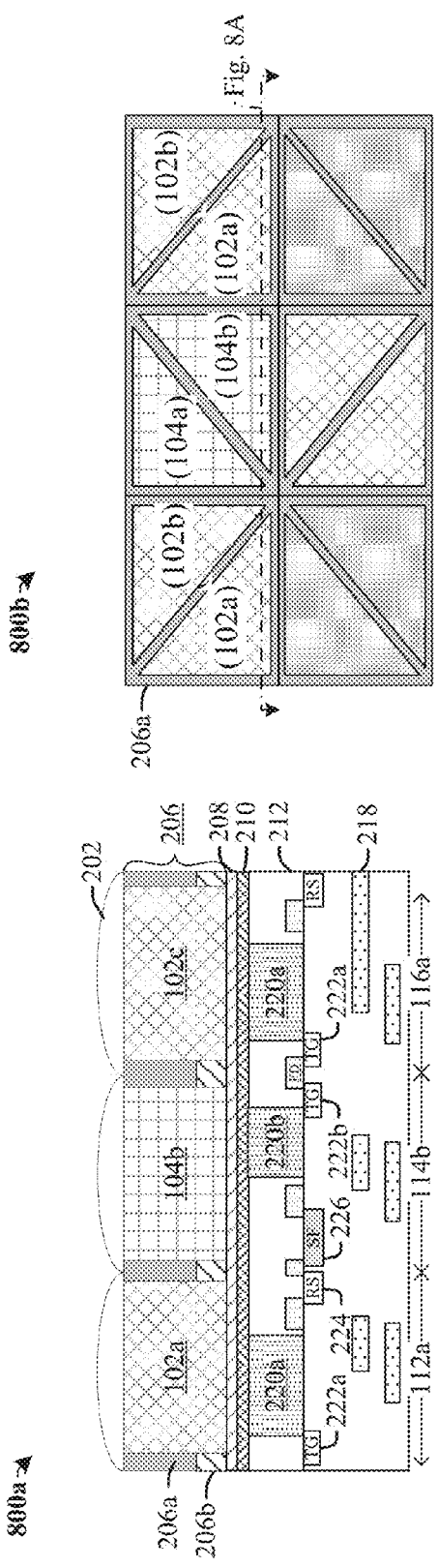

As shown in cross-sectional view 800a of FIG. 8A and top view 800b of FIG. 8B, color filters (e.g. 102a, 102b, 104a, 104b) are formed overlying the corresponding photodiodes 220a, 220b. In some embodiments, an antireflective layer 208 and/or a buffer layer 210 are formed over the substrate 212. A metal grid structure 206b is disposed over the antireflective layer 208 between the color filters. A dielectric light guide structure 206a is formed over the metal grid structure 206b. In some embodiments, the antireflective layer 208, the buffer layer 210, and the dielectric light guide structure 206a can be firstly formed using one or more of deposition processes (e.g., chemical vapor deposition (CVD)). Then a series of etch processes are performed to pattern the dielectric light guide structure 206a and the metal grid structure 206b to form openings for the color filters.

Then color filters are formed within the openings. The color filters are assigned colors, such as red, green, and blue, and configured to transmit the assigned colors while blocking other colors. In some embodiments, a first pair of left and right color filters, such as a left color filter 102a and a right color filter 102b, is assigned one same color. A second pair of color filters next to the first pair, such as a left color filter 104a and a right color filter 104b can be assigned a different color. The process for forming the color filters may include, for each of the color assignments, forming a color filter layer and patterning the color filter layer. The color filter layer may be formed so as to fill the assigned openings and to cover the dielectric light guide structure 206a. The color filter layer may then be planarized and/or etched back to approximately even an upper surface of the dielectric light guide structure 206a.

In some embodiments, each of the color filters has a right triangle-shape from the top view (as shown in FIG. 8B). Though not shown in the figures, in some embodiments, a second buffer layer can be formed over the color filters, and micro-lenses 202 can be formed over the second buffer layer. The second buffer layer may be formed by, for example, one or more of vapor deposition, atomic layer deposition (ALD), spin coating, and the like. The micro-lens 202 may be, for example, formed of the same material as the second buffer layer and/or formed using, for example, one or more of vapor deposition, ALD, spin coating, and the like. After forming a microlens layer, the microlens layer is patterned to define footprints of corresponding microlenses. For example, a photoresist layer masking select regions of the microlens layer may be formed over the microlens layer, used as a mask during a etch of the microlens layer, and subsequently removed. With the microlens layer patterned, one or more reflow and/or heating processes can be performed on the patterned microlens layer to round corners of the patterned microlens layer.

Figure 9:
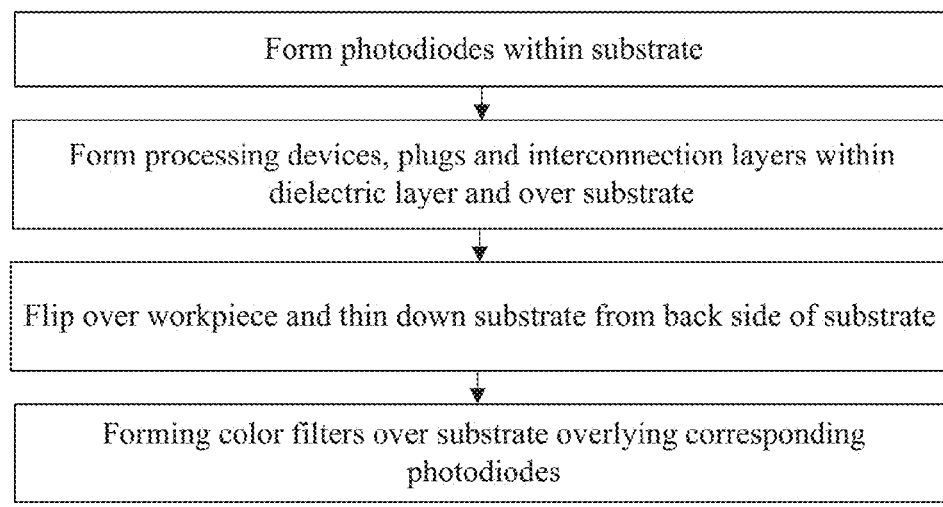
FIG. 9 illustrates a flow diagram of some embodiments of a method for manufacturing a CMOS image sensor pixel array including image sensing pixels.

FIG. 9 shows a flow diagram 900 of some embodiments of a method for manufacturing an integrated circuit including image sensing pixels and phase detection pixels.

At act 902, a substrate is provided. An array of photodiodes is formed within the substrate. Some embodiments of a cross-sectional view and a top view corresponding to act 902 are illustrated in FIGS. 5A-5B.

At act 904, processing devices, including transfer transistors, reset switch transistors, and source follower transistors are formed over the substrate. Gates of the processing devices are formed to separate from the substrate by gate dielectrics. Source/drain regions are formed within the substrate alongside the corresponding gates. A plurality of dielectric layers is formed over the substrate. Plugs and interconnection layers are formed within the dielectric layers to couple the processing devices. Some embodiments of a cross-sectional view and a top view corresponding to act 904 are illustrated in FIGS. 6A-6B.

At act 906, the workpiece is flipped over and thinned down from a back side of the substrate. Photodiodes may be exposed from the back side of the substrate after the thinning process. Some embodiments of a cross-sectional view corresponding to act 906 are illustrated in FIG. 7.

At act 908, color filters are formed overlying the corresponding photodiodes. In some embodiments, an antireflective layer and/or a buffer layer are formed between the photodiodes and the color filters. Some embodiments of a cross-sectional view and a top view corresponding to act 908 are illustrated in FIGS. 8A-8B.

Thus, as can be appreciated from above, the present disclosure relates to an image sensor having a floating node and/or a set of processing devices, such as a reset switch transistor and a source follower transistor, arranged at a cross region of a 2×2 phase detection pixel array. By sharing floating node regions and/or processing devices between four phase detection pixels, chip spaces are efficiently used and sensitivities of the image sensor can be improved.

In some embodiments, the present disclosure relates to a CMOS image sensor pixel array. The CMOS image sensor pixel array comprises first and second image sensing pixels arranged one next to another in a row. Each of the first and second image sensing pixels respectively comprises a left PD pixel including a left photodiode operably coupled to a left transfer gate, and a right PD pixel including a right photodiode operably coupled to a right transfer gate. The right transfer gate of the second image sensing pixel is a mirror image of the left transfer gate of the first image sensing pixel along a boundary line between the first and second image sensing pixels. The left transfer gate of the second image sensing pixel is a mirror image of the right transfer gate of the first image sensing pixel along the boundary line.

In other embodiments, the present disclosure relates to a CMOS image sensor pixel array. The CMOS image sensor pixel array comprises first and second image sensing pixels arranged one next to another in a row. Each of the first and second image sensing pixels respectively comprises a left PD pixel including a left color filter, a left photodiode and a left transfer gate, and a right PD pixel including a right color filter, a right photodiode and a right transfer gate. The left color filter and the right color filter of the first image sensing pixel are configured to filter a first spectrum of radiation, and the left color filter and the right color filter of the second image sensing pixel are configured to filter a second spectrum of radiation that is different from the first spectrum of radiation. The left and right PD pixels of the first image sensing pixel are separated along a line extending in a first direction, and the left and right PD pixels of the second image sensing pixel are separated along a line extending a second direction that is different from the first direction.

In yet other embodiments, the present disclosure relates to a CMOS image sensor pixel array. The CMOS image sensor pixel array comprises first convex micro-lens and an adjacent second convex micro-lens arranged in a row. The CMOS image sensor pixel array further comprises a first image sensing pixel underlying the first convex micro-lens and a second image sensing pixel underlying the second convex micro-lens. Each of the first and second image sensing pixels respectively comprising a left PD pixel and an adjacent right PD pixel. The left PD pixel includes a left color filter, a left photodiode and a left transfer gate, and the right PD pixel includes a right color filter, a right photodiode and a right transfer gate. The left and right PD pixels of the first image sensing pixel are separated along a first direction, and the left and right PD pixels of the second image sensing pixel are separated along a second direction that is different from the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A CMOS image sensor pixel array, comprising:
   first and second image sensing pixels arranged one next to another in a row, each of the first and second image sensing pixels respectively comprising a left PD (phase detection) pixel including a left photodiode operably coupled to a left transfer gate, and a right PD pixel including a right photodiode operably coupled to a right transfer gate;
   wherein the right transfer gate of the second image sensing pixel is a mirror image of the left transfer gate of the first image sensing pixel along a boundary line between the first and second image sensing pixels;
   wherein the left transfer gate of the second image sensing pixel is a mirror image of the right transfer gate of the first image sensing pixel along the boundary line;
   wherein the right transfer gate of the first image sensing pixel and the left transfer gate of the second image sensing pixel are operably coupled to a common floating node region.

2. The CMOS image sensor pixel array of claim 1, wherein a first separating line between the left PD pixel and the right PD pixel of the first image sensing pixel extends in a first direction non-orthogonal to the boundary line.

3. The CMOS image sensor pixel array of claim 1, further comprising:
   a reset switch transistor and a source follower transistor disposed between the left photodiode of the first image sensing pixel and the right photodiode of the second image sensing pixel.

4. The CMOS image sensor pixel array of claim 1,
   wherein each of the left PD pixel and the right PD pixel has a right triangle-shape;
   wherein hypotenuses of the left and right PD pixels of the first image sensing pixel are perpendicular to those of the left and right PD pixels of the second image sensing pixel.

5. The CMOS image sensor pixel array of claim 1,
   wherein each of the first and second image sensing pixels respectively comprising a left color filter overlying the left photodiode, and a right color filter overlying the right photodiode;
   wherein the left color filter and the right color filter of the first image sensing pixel are configured to filter the same spectrum of radiation;
   wherein the first image sensing pixel and the second image sensing pixel are configured to detect different spectrums of radiation.

6. The CMOS image sensor pixel array of claim 5, further comprising:
   a composite grid separating the left color filter of the first image sensing pixel and the right color filter of the second image sensing pixel, the composite grid comprising a metal grid disposed within a silicon dioxide grid.

7. The CMOS image sensor pixel array of claim 6, wherein the composite grid is disposed between the left and right color filters of the first image sensing pixel.

8. The CMOS image sensor pixel array of claim 7, wherein the composite grid has a smaller height between the left and right color filters of the first image sensing pixel than between the first and second image sensing pixels.

9. The CMOS image sensor pixel array of claim 1, further comprising:
   a first portion of an isolation structure disposed between the right photodiode of the first image sensing pixel and the left photodiode of the second image sensing pixel.

10. The CMOS image sensor pixel array of claim 9, further comprising:
   a second portion of the isolation structure disposed between the left and right photodiodes of the first image sensing pixel;
   wherein the second portion of the isolation structure has a depth that is shallower than the first portion of the isolation structure.

11. The CMOS image sensor pixel array of claim 1, further comprising:
   third and fourth image sensing pixels arranged in a second row below the first and second image sensing pixels, each of the third and fourth image sensing pixels respectively comprising a left PD pixel including a left color filter, a left photodiode and a left transfer gate, and a right PD pixel including a right color filter, a right photodiode and a right transfer gate;
   wherein the common floating node region is further coupled to the right transfer gate of the third image sensing pixel and the left transfer gate of the fourth image sensing pixel.

12. A CMOS image sensor pixel array, comprising:
   first and second image sensing pixels arranged one next to another in a row, each of the first and second image sensing pixels respectively comprising a left PD pixel including a left color filter, a left photodiode and a left transfer gate, and a right PD pixel including a right color filter, a right photodiode and a right transfer gate;
   wherein the left color filter and the right color filter of the first image sensing pixel are configured to filter a first spectrum of radiation, and the left color filter and the right color filter of the second image sensing pixel are configured to filter a second spectrum of radiation that is different from the first spectrum of radiation;

wherein the left and right PD pixels of the first image sensing pixel are separated along a first separating line extending in a first direction, and the left and right PD pixels of the second image sensing pixel are separated along a second separating line extending in a second direction that is different from the first direction;

wherein the left PD pixel of the first image sensing pixel and the right PD pixel of the second image sensing pixel share a reset switch transistor and a source follower transistor;

wherein the left transfer gate of the first image sensing pixel and the right transfer gate of the second image sensing pixel are arranged at outer sides away from a boundary line of the first and second image sensing pixels.

13. The CMOS image sensor pixel array of claim 12, wherein the second direction is perpendicular to the first direction.

14. The CMOS image sensor pixel array of claim 12, wherein the right transfer gate of the first image sensing pixel and the left transfer gate of the second image sensing pixel are arranged at inner sides close to a boundary line between the first and second image sensing pixels and share a common floating node region.

15. The CMOS image sensor pixel array of claim 12, wherein the left and right color filters of the first image sensing pixel are separated by a composite grid disposed therebetween.

16. The CMOS image sensor pixel array of claim 12, wherein the left PD pixel and the right PD pixel of the first image sensing pixel are collectively configured as one image sensing pixel.

17. The CMOS image sensor pixel array of claim 12, wherein a trench isolation structure is disposed between the left and right photodiodes of the first image sensing pixel.

18. The CMOS image sensor pixel array of claim 12, wherein the left PD pixel and the right PD pixel of the first image sensing pixel respectively have right triangle-shapes and is opposing to one another along hypotenuses of the right triangle-shapes.

19. The CMOS image sensor pixel array of claim 12, further comprising:

third and fourth image sensing pixels arranged in a second row below the first and second image sensing pixels, each of the third and fourth image sensing pixels respectively comprising a left PD pixel including a left color filter, a left photodiode and a left transfer gate, and a right PD pixel including a right color filter, a right photodiode and a right transfer gate;

wherein the left PD pixel of the third image sensing pixel and the right PD pixel of the fourth image sensing pixel further share the reset switch transistor and the source follower transistor.

20. A CMOS image sensor pixel array, comprising:

a first convex micro-lens and an adjacent second convex micro-lens arranged in a row and physically contact each other; and a first image sensing pixel underlying the first convex micro-lens and a second image sensing pixel underlying the second convex micro-lens, each of the first and second image sensing pixels respectively comprising a left PD pixel and an adjacent right PD pixel;

wherein the left PD pixel includes a left color filter, a left photodiode and a left transfer gate, and the right PD pixel includes a right color filter, a right photodiode and a right transfer gate;

wherein the left and right PD pixels of the first image sensing pixel are separated along a first direction, and the left and right PD pixels of the second image sensing pixel are separated along a second direction that is different from the first direction.

* * * * *